United States Patent [19]

Fujikawa et al.

[11] Patent Number: 5,906,281
[45] Date of Patent: May 25, 1999

[54] ANTI-STATIC PACKING CONTAINER

[75] Inventors: Hisashi Fujikawa, Ayama-gun; Youki Yoneda, Sakai; Sigeharu Kawazu; Minoru Sakamoto, both of Nara, all of Japan

[73] Assignees: Sharp Kabushiki Kaisha, Osaka; Kabushiki Kaisha Uchiyama Konpo, Nara, both of Japan

[21] Appl. No.: 08/456,802

[22] Filed: Jun. 1, 1995

[30] Foreign Application Priority Data

Jan. 17, 1995 [JP] Japan .................................. 7-004982

[51] Int. Cl.⁶ .................................................. B65D 73/02
[52] U.S. Cl. ........................................... 206/721; 206/719
[58] Field of Search .................................. 206/709, 721, 206/701, 719

[56] References Cited

U.S. PATENT DOCUMENTS

| | | | |
|---|---|---|---|
| 4,293,070 | 10/1981 | Ohlbach | 206/709 |
| 4,308,953 | 1/1982 | Cohen | 206/709 |
| 4,609,104 | 9/1986 | Kasper et al. | 206/709 |
| 5,205,406 | 4/1993 | Bradford | 206/721 |

FOREIGN PATENT DOCUMENTS 5-319403  12/1993  Japan .

OTHER PUBLICATIONS

"Shielding Method and its Characteristic", Electronic Circuit Part Application Manual, vol. 1, p. 478, published in Nov., 1988) and English translation.

"Handbook of Electrostatics", (Electrostatics Society, OHM Corporation, the second impression of the first edition).

*Primary Examiner*—Paul T. Sewell
*Assistant Examiner*—Nhan T. Lam
*Attorney, Agent, or Firm*—Nixon & Vanderhye

[57] ABSTRACT

As to a packing container, when a corrugated cardboard sheet where metallic foil is stuck on one of its sides is assembled so as to have a box-shape, an edge left for applying paste and a side on which the edge left for applying paste is stuck are connected by metallic foil tape so that metallic foil on the sides inside the box joins along an internal circumferential surface of the box. As a result, since a closed path is formed along the internal circumference of the packing container, partial charging of a packing container is prevented by short-circuiting or shielding charged static electricity, and an electrostatic breakdown of contents, such as a semiconductor device, is prevented.

10 Claims, 2 Drawing Sheets

ANTI-STATIC PACKING CONTAINER

FIELD OF THE INVENTION

The present invention relates to a packing container for protecting parts of electronic equipments, etc. against static electricity when they are transported, etc.

BACKGROUND OF THE INVENTION

Packaging containers for electronic equipment parts (e.g., electronic components), such as those formed from corrugated cardboard, etc., typically do not shield the parts from static electricity.

When measures are taken to protect packaged electronic parts against static electricity, the parts are typically placed into something like an electrically conductive sack and are then stored in a packing container, such as corrugated cardboard.

However, in the case where a packing container, such as a corrugated cardboard, where measures are not taken to shield the static electricity is used, there arise problems that value of a commodity is lost due to contamination caused by attraction of static electricity for dust in the air and that a circuit of electronic parts which is a content may be broken because static electricity supplied to a packing material of a packing container is discharged.

In addition, when measures are taken against static electricity by using something like an electrically conductive sack, there also arises a problem that expenses are greatly increased due to increase in cost of a packing material, increase in process of packing, etc.

SUMMARY OF THE INVENTION

It is an object of the present invention to provide a packing container which is capable of protecting electronic parts, etc. against static electricity without increasing costs of materials and production.

In order to solve the above problem, the packing container of the present invention is characterized by including a molded member for forming the packing container, and an antistatic member having electrical conducting for forming a closed path (circuit) along an internal circumference of the packing container to be formed by the molded member, the antistatic member having electrical conductivity. With the above arrangement, since the antistatic member forms the closed path along the internal circumference of the container formed by the molded member, static electricity applied to the molded member is short-circuited or shielded by the path, thereby making it possible to prevent an electrostatic breakdown of contents, such as electronic parts.

As the antistatic member, an electrostatically conductive substance is applicable, but it is desirable that a substance having surface resistivity of more than $10^3$ Ω/sq to less than $10^6$ Ω/sq is applied. Moreover, the antistatic member may be laminated on a surface of the container by forming it like a film, or the antistatic member can be applied to the surface of the container by forming it like powder or paste. As such an antistatic member, metal, electrically conductive resin, or carbon can be used.

In addition, the molded member is formed like a box and the antistatic member is formed on the surface inside the box-shaped molded member. Further, the packing container can be arranged so as to include tape with electrical conductivity for connecting antistatic members on adjoining sides. Moreover, with an arrangement that a corrugated cardboard sheet is used as the molded member and metallic foil is stuck on one side of the corrugated cardboard sheet so as to be formed like a box, for example, entrance of moisture can be prevented by the metallic foil, thereby making it possible to prevent corrosion of the contents and to prevent an electrostatic breakdown of the contents by electrostatic discharge.

In addition, the antistatic member can be arranged such that films composed of an electrostatically conductive substance which have been formed like a polygon are combined together on a vertex of the polygon. As a result, an amount of antistatic members to be used for a container can be decreased, thereby making it possible to avoid increase in cost due to a steep rise in cost of materials.

For a fuller understanding of the nature and advantages of the invention, reference should be made to the ensuing detailed description taken in conjunction with the accompanying drawings.

DESCRIPTION OF THE EMBODIMENTS
FIRST EMBODIMENT

Figure 1:
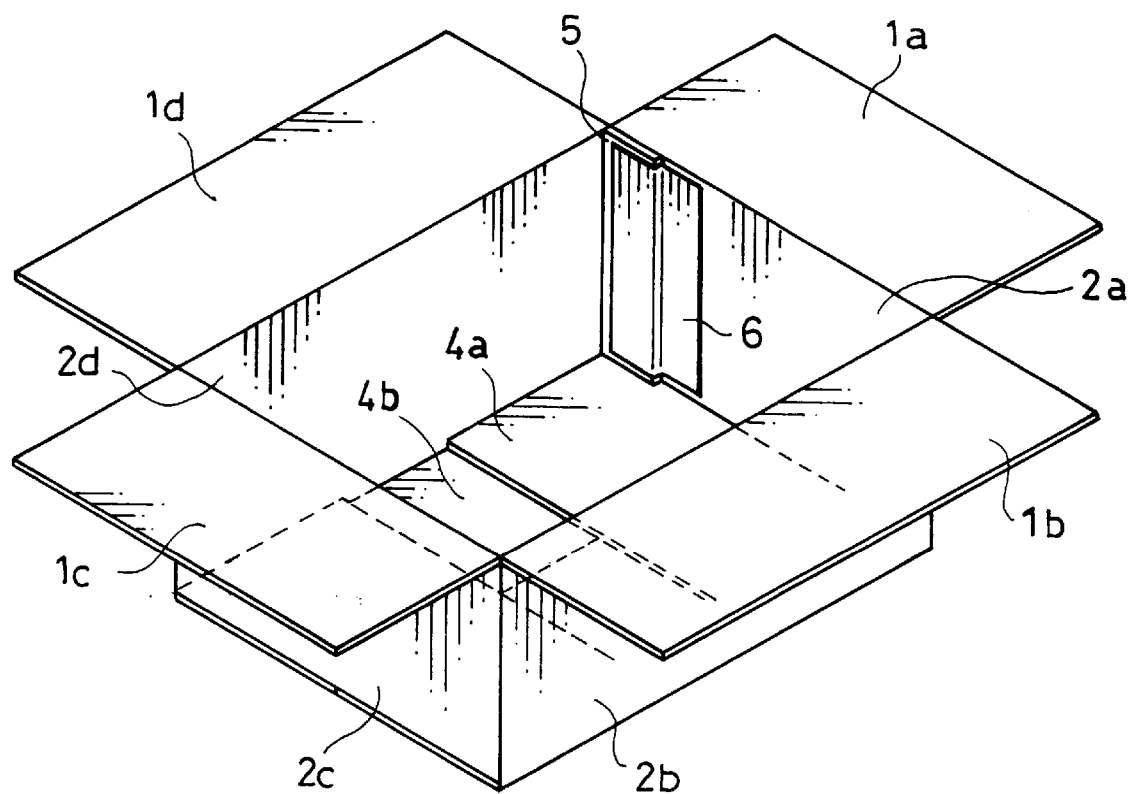
FIG. 1 is a perspective view which shows an arrangement of a packing container in one embodiment of the present invention.
Figure 2:
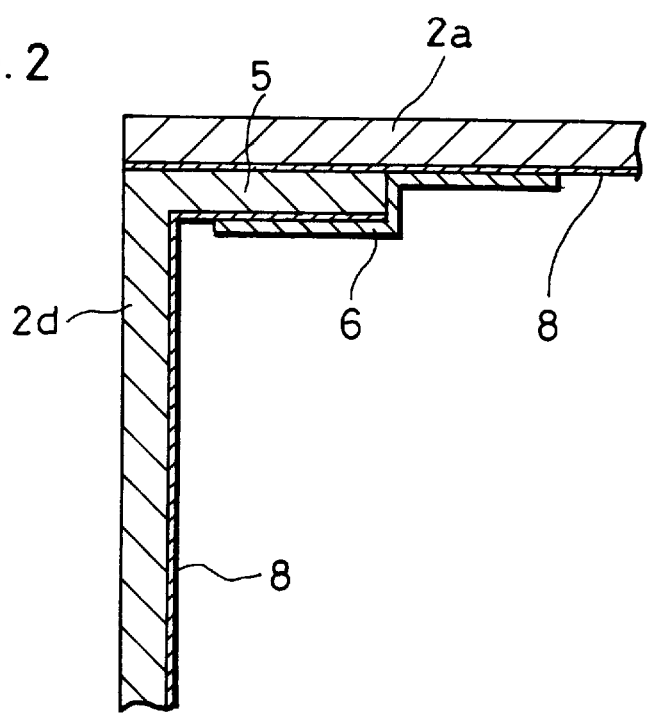
FIG. 2 is a cross section which shows a state where a side board is bonded to an edge left for applying paste by means of metallic foil tape in the above packing container.

The following will discuss one embodiment of the present invention referring to FIGS. 1 and 2.

FIG. 1 is a perspective view which shows a state during assembly of a packing container of the present embodiment. The packing container is arranged such that metallic foil, such as aluminum foil, is stuck on whole one side of a corrugated cardboard sheet. Four sides or panels 2a, 2b, 2c and 2d shown in FIG. 1 are connected in series, with sides 2a and 2d serving as end sides or end panels. An edge or flange left 5 for applying adhesive 5 is provided to an end of the side 2d.

In addition, upper flaps 1a through 1d are connected respectively on upper ends of the sides 2a through 2d. Moreover, four lower flaps 4a, 4b . . . are connected respectively on lower ends of the sides 2a through 2d.

A procedure for assembly of the packing container is as follows. First, when the four sides 2a, 2b, 2c and 2d are folded so that the faces to which the metallic foil is secured are orientated toward one another, thereby forming a square frame. Next, the edge or flange left 5 for applying adhesive 5 is stuck on an inner face of the side 2a. Successively, a base is formed by the four lower flaps 4a, 4b . . . . With the above procedure, a box-shaped packing container is formed.

Here, on this stage, in the bonded portion between the edge left 5 for applying adhesive 5 and the side 2a, since the metallic foil stuck on one face of the side 2a and the metallic foil stuck on one face of the edge 5 left for applying adhesive are separated by a thickness of a corrugated cardboard of the edge left for applying adhesive 5, they do not directly contact with each other. In other words, the metallic foil on the both faces is electrically insulated from each other. Therefore, in order to join the metallic foil on the both faces, metallic foil tape 6 is stuck across the metallic foil on the both faces. As a result, the metallic foil of the edge left 5 for applying adhesive 5 and the metallic foil of the side 2a are connected, thereby forming a ring of metallic foil along the inner face of the sides 2a, 2b, 2c and 2d of the packing container.

FIG. 2 is a cross section which shows a state that the side 2a and the edge left 5 for applying adhesive 5 are connected. As is clear from the drawing, since the metallic foil 8 stuck to the inner face of the side 2a and the metallic foil 8 stuck to the inner face of the edge left 5 for applying adhesive 5 are separated by the thickness of the corrugated cardboard of the edge left for applying adhesive 5, they do not directly contact with each other, but they are connected by the metallic foil tape 6.

As mentioned above, the packing container of the present embodiment prevents entrance of moisture from outside by sticking metallic foil composed of an electrostatically conductive material on the whole inner face of the packing container. This is effective in preventing corrosion of parts of electronic equipments. Moreover, since the inner section of the packing container is electromagnetically separated from outside, an electrostatic breakdown of contents in the packing container due to inductive electrification (electrostatic induction) is prevented. Further, it is possible to prevent contamination of contents by attracting dust, etc. through static electricity. In addition, since the metallic foil ring is formed by connecting the metallic foil of the edge left 5 for applying adhesive with the metallic foil of the one side through the metallic foil tape, partial charging of the packing container can be prevented by positively short-circuiting or shielding static electricity. In addition, since another container, such as an electrically conductive sack, is not necessary, it is possible to avoid increase in expenses due to increase in cost of a packing material and increase in process of packing.

SECOND EMBODIMENT

Figure 3:
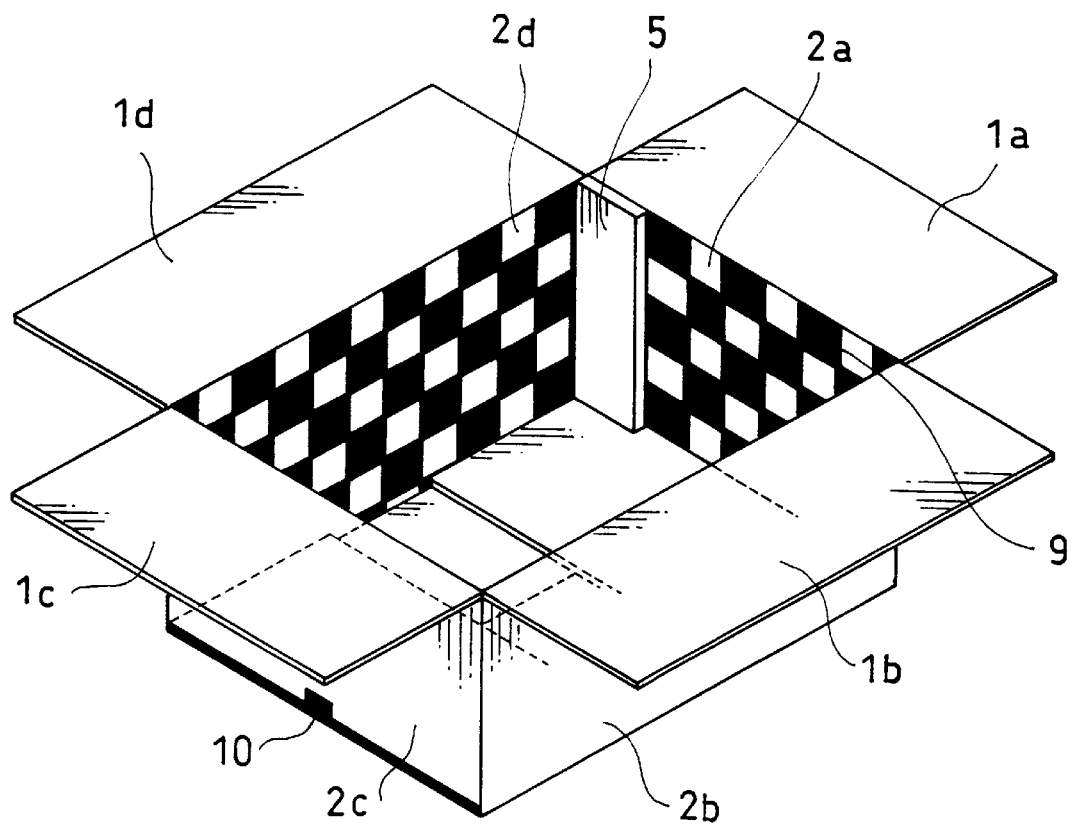
FIG. 3 is a perspective view which shows an arrangement of a packing container in another embodiment of the present invention.

The following will discuss another embodiment of the present invention referring to FIG. 3.

As to a material of a packing container of the present embodiment, a corrugated cardboard sheet which is same as in the first embodiment is used, and a procedure for its assembly is also same as in the first embodiment. However, the packing container of the present embodiment does not have an arrangement that metallic foil is stuck on a whole inner face of a corrugated cardboard sheet as mentioned in the first embodiment, but has an arrangement that metallic foil 9 composed of films which is connected together so as to have a checkerboard-like structure is stuck on one face of a corrugated cardboard sheet and the corrugated cardboard sheet is assembled so as to have a box-shape. Here, also in this arrangement, an edge 5 left for applying adhesive is connected to a side 2a by means of metallic foil so that metallic foil 9 has a ring-like structure along an inner face of the foil.

In this way, an inner section of a packing container can be electromagnetically separated from outside also by metallic foil composed of films which is connected together so as to have a checkerboard-like structure, thereby making it possible to prevent an electrostatic breakdown of contents due to inductive electrification (electrostatic induction). Moreover, since metallic foil usage is small, increase in expenses due to increase in cost of a packing material can be prevented.

In addition, a shape of metallic foil is not limited to the above checkerboard-like structure, so needless to say, it may have also a honeycomb structure or a structure where triangles are connected, etc., for example. When the metallic foil has a connected structure over a whole inner face of the packing container, a partial charging of the packing container can be prevented by positively short-circuiting or shielding static electricity.

Here, the aforementioned embodiments illustrate the arrangement where metallic foil and metallic foil tape are used as antistatic members, but the antistatic member which is applicable to the present invention is not limited to this. In other words, a member composed of an electrostatically conductive substance in substances shown in the following Table 1 can be applied to the present invention as the antistatic member.

TABLE 1

| | |
|---|---|
| Electrostatically shielding substance | Material for holding an ability to attenuate an electrostatic field Material which holds a layer with surface resistivity of less than $10^4$ Ω/sq, or material with volume resistivity of less than $10^3$ Ω · cm per 1 mm thickness of material |
| Electrostatically conductive substance | Material with surface resistivity of $10^3$ to $10^6$ Ω/sq, or Material with volume resistivity of $10^2$ to $10^5$ Ω · cm |
| Electrostatically diffusive substance | Material with surface resistivity of $10^5$ to $10^{12}$ Ω/sq, or Material with volume resistivity of $10^4$ to $10^{11}$ Ω · cm |
| Insulating substance | Material with surface resistivity of not less than $10^{12}$ Ω/sq, or Material with volume resistivity of not less than $10^{11}$ Ω · cm |

As a material of the antistatic member of the present invention, the electrostatically conductive substance in the substances shown in Table 1 can be used, but it is desirable that the electrostatically conductive substance with surface resistivity of $10^3$ to $10^6$ Ω/sq is used. In other words, surface resistivity of paper ware, such as a corrugated cardboard, is generally $10^{16}$ to $10^{17}$ Ω/sq. When an electrostatically conductive substance, such as aluminum, carbon, is stuck to or mixed with a surface or an inner section of the paper ware, the paper is made moisture-proof and its surface resistivity is lowered to $10^3$ to $10^6$ Ω/sq, thereby making it possible to leak and diffuse charges. Incidentally, in the case where surface resistivity of a packing container is smaller than $10^3$ Ω/sq or bigger than $10^6$ Ω/sq, inductive electrification, frictional electrification, or peeling electrification, etc. may occurs. As a result, an electrostatic breakdown of contents in the container possibly occurs.

In addition, a reason why the above electrostatically conductive substance is desirable as the antistatic member is as follows. Namely, a semiconductor device, such as a liquid crystal panel, is a conductor electrostatically, and in order to efficiently prevent an electrostatic breakdown of such a semiconductor device, it is desirable that electrostatic performance of a packing container can obtain surface resistivity ($10^3$ to $10^6$ Ω/sq) which is same as of a conductor.

Here, as a concrete example of an action of the packing container in the present embodiment, the following will discuss a case where a liquid crystal panel which is a typical part of an electronic equipment which is easily affected by static electricity is packed by using the packing container. Each dot of the liquid crystal panel has a gate electrode, and the gate electrode is insulated against a source electrode and a drain electrode through a gate insulating film. However, when static electricity is generated, an electric field is generated around the gate electrode and the gate electrode and the source electrode are leaked, so quality of the liquid crystal panel becomes possibly defective. An electrostatic breakdown occurs on a liquid crystal panel due to a voltage of 50 to 100 V, but in the case where the liquid crystal panel is stored in the packing container of the present embodiment, the liquid crystal panel resist a voltage of 2 kV, so the electrostatic breakdown does not occur.

Here, for example, even when antistatic member usage becomes smaller because of the aforementioned arrangement that metallic foil has a checkerboard-like structure, in the case where contents of the packing container is composed of a material which holds an ability to attenuate an electrostatic field, such as a static electricity shielding substance shown in the above Table, leakage of charges occurs in a manner that charges contact with the metallic foil, thereby making it possible to lower a charged electric potential.

The above embodiments discussed the example that the metallic foil is used as the antistatic member, but beside the metallic foil, a PE film with electrostatic conductivity composed of a metallic material, such as Au, Ag, Fe, Cu, Mg, which is laminated by heating, adhesion, or coating, can be also used. Moreover, in this case, in order to lower electric resistance of macromolecules, it is desirable that an organic chemical or a surface active agent, etc. is used at the time of laminating.

In addition, an electrostatically conductive substance includes an electrostatically volume conductive substance and an electrostatically surface conductive substance. The former has a conductive characteristic in a volume direction, the latter has a conductive characteristic in a face direction of its surface. More concretely, the former is obtained by kneading conductive carbon in resin, for example. The latter is obtained by applying or sticking a carbon sheet, various metallic powder or metallic foil, electrically conductive paste or an electrically conductive resin sheet, etc. to a surface of the substance.

In addition, the above embodiments discussed the example that the metallic foil as the antistatic member is stuck on the inner surface of the packing container. However, the present invention is not limited to this, so the present invention may have an arrangement that the antistatic member is formed on an outer face of the packing container or that the antistatic member is formed in a molded member which forms the packing container like a layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A packing container, comprising:
   a packaging member which is formed to provide a bounded shape to the packing container, the packaging member when in the bounded shape having an inner surface which faces the interior of the packing container;
   an antistatic member for forming a closed electrically conductive path along the inner surface of said packing container, said antistatic member being formed of an electrostatically conductive metal foil; and
   an electrically conductive tape for connecting two adjoining ends of the inner surface of the packaging member including said metal foil.

2. The packing container as defined in claim 1, wherein said antistatic member is formed as a film laminated on the inner surface of said packaging member.

3. The packing container as defined in claim 1, wherein said antistatic member has surface resistivity of more, than $10^3$ Ω/sq to less than $10^6$ Ω/sq.

4. The packing container as defined in claim 1, wherein said packaging member is formed so as to have a quadrilateral shape.

5. The packing container as defined in claim 1, wherein said antistatic member is arranged such that films composed of an electrostatically conductive substance, which are formed so as to have a polygon shape, are combined together on a vertex of the polygon.

6. The packing container as defined in claim 5, wherein said polygon is a quadrangle.

7. The packing container as defined in claim 5, wherein said polygon is a hexagon.

8. The packing container as defined in claim 5, wherein said polygon is a triangle.

9. The packing container as defined in claim 1, wherein said packaging member is a corrugated cardboard sheet.

10. A packing container, comprising:
    a packaging member having a plurality of panels which enables the packaging member to be folded into a bounded shape, the plurality of panels including a first end panel and a second end panel, the first end panel having a flange thereon, the flange member of the first end panel abutting the second end panel when the packaging member is folded into its bounded shape, the packaging member when folded into the bounded shape having an inner surface which faces the interior of the packing container;
    an antistatic member formed on the inner surface of the packaging member and formed of an electrostatically conductive metal foil; and
    an electrically conductive tape which extends between the flange of the first end panel to the second end panel and which extends over an edge of the flange in contact with said metal foil alone the flange and the second end panel, whereby a closed electrically conductive path is provided along the inner surface of said packing container including at an edge of the flange, thereby precluding the edge of the flange from constituting an electrical discontinuity along the inner surface of said packing container.

* * * * *